United States Patent
Yi et al.

(10) Patent No.: US 6,713,391 B2
(45) Date of Patent: Mar. 30, 2004

(54) PHYSICAL VAPOR DEPOSITION TARGETS

(75) Inventors: Wuwen Yi, Spokane, WA (US); Diana Morales, Veradale, WA (US); Chi Tse Wu, Veradale, WA (US); Ritesh P. Shah, San Jose, CA (US); Jeff A. Keller, Spokane, WA (US)

(73) Assignee: Honeywell International Inc., Morristown, NJ (US)

( * ) Notice: Subject to any disclaimer, the term of this patent is extended or adjusted under 35 U.S.C. 154(b) by 70 days.

(21) Appl. No.: 10/046,330

(22) Filed: Oct. 25, 2001

(65) Prior Publication Data

US 2002/0102849 A1 Aug. 1, 2002

Related U.S. Application Data

(60) Continuation-in-part of application No. 09/578,829, filed on May 24, 2000, which is a division of application No. 09/108,610, filed on Jul. 1, 1998, now Pat. No. 6,258,719.
(60) Provisional application No. 60/052,262, filed on Jul. 11, 1997, and provisional application No. 60/306,812, filed on Jul. 19, 2001.

(51) Int. Cl.[7] .............................................. H01L 21/44
(52) U.S. Cl. ...................................... 438/682; 438/785
(58) Field of Search ................................ 438/682, 715, 438/719, 721, 753, 755, 754, 767, 785

(56) References Cited

U.S. PATENT DOCUMENTS

| | | | |
|---|---|---|---|
| 4,619,697 A | 10/1986 | Hijikata et al. | |
| 4,663,120 A | 5/1987 | Parent et al. | |
| 4,762,558 A | 8/1988 | German et al. | |
| 4,889,745 A | 12/1989 | Sata | |
| 4,915,903 A | 4/1990 | Brupbacher et al. | |
| 5,294,321 A | 3/1994 | Satou et al. | |
| 5,320,729 A | 6/1994 | Narizuka et al. | |
| 5,330,701 A | 7/1994 | Shaw et al. | |
| 5,409,517 A | 4/1995 | Satou et al. | |
| 5,415,829 A | 5/1995 | Ohhashi et al. | |
| 5,418,071 A | 5/1995 | Satou et al. | |
| 5,464,520 A | 11/1995 | Kano et al. | |
| 5,508,000 A | 4/1996 | Satou et al. | |
| 5,559,065 A | * 9/1996 | Lauth et al. | |
| 5,608,911 A | 3/1997 | Shaw et al. | |
| 5,612,571 A | 3/1997 | Satou et al. | |
| 5,618,397 A | 4/1997 | Kano et al. | |
| 5,763,923 A | * 6/1998 | Hu et al. | |
| 5,919,321 A | 7/1999 | Hirakawa | |
| 5,955,685 A | 9/1999 | Na | |
| 6,033,537 A | 3/2000 | Suguro | |
| 6,214,177 B1 | 4/2001 | Runkle | |

FOREIGN PATENT DOCUMENTS

| JP | 01136969 | 5/1989 |
|---|---|---|
| JP | 01249619 | 10/1989 |

* cited by examiner

*Primary Examiner*—Phuc T. Dang
(74) *Attorney, Agent, or Firm*—Wells St. John P.S.

(57) ABSTRACT

The invention includes a non-magnetic physical vapor deposition target. The target has at least 30 atom percent total of one or more of Co, Ni, Ta, Ti, Pt, Mo and W, and at least 10 atom percent silicon. The target also has one phase and not more than 1% of any additional phases other than said one phase. In another aspect, the invention includes a non-magnetic physical vapor deposition target consisting essentially of Co and/or Ni, silicon, and one phase.

24 Claims, 6 Drawing Sheets

PHYSICAL VAPOR DEPOSITION TARGETS

RELATED APPLICATION DATA

This application is a continuation-in-part of U.S. patent application Ser. No. 09/578,829, which was filed on May 24, 2000, and which is a divisional application of U.S. patent application Ser. No. 09/108,610, which was filed on Jul. 1, 1998, which is now U.S. Pat. No. 6,258,719 B1, and which claims priority to U.S. Provisional Application Ser. No. 60/052,262 filed Jul. 11, 1997. This application also claims priority to U.S. Provisional Application Ser. No 60/306,812, which was filed on Jul. 19, 2001.

TECHNICAL FIELD

The invention pertains to physical vapor deposition targets, and to methods of forming physical vapor deposition targets.

BACKGROUND

Physical vapor deposition targets (such as, for example, sputtering targets) are utilized for deposition of thin films of materials. Typically, a physical vapor deposition target will be placed within a chamber, and subsequently impacted with high energy particles to displace materials from a surface of the target. The displaced materials then settle onto a substrate, to form a thin film of the materials across the substrate. Commonly, the substrate will comprise a semiconductor construction, and the thin film materials deposited thereon will ultimately be incorporated into a semiconductor device.

Among the materials which are desired for semiconductor device fabrication are various silicon-comprising materials, such as, for example, cobalt silicide, nickel silicide, tantalum silicide, titanium silicide, platinum silicide, molybdenum silicide, and tungsten silicide. It would be desirable to form targets comprising combinations which include one or more of cobalt, nickel, tantalum, titanium, platinum, molybdenum and tungsten; in combination with silicon.

Refractory metals and their suicides are widely used in CMOS DRAMs and logic circuits. Silicides offer lower resistivity compared to doped silicon. In addition, silicides also offer higher thermal stability compared to conventional interconnect materials such as aluminum. There are several ways to obtain refractory metal silicide films on the wafer. The most common method to obtain metal silicide is through the salicide process. A salicide process for obtaining titanium silicide film on a wafer can comprise the following:

1. a layer of Ti is deposited on a wafer by sputtering;
2. a first rapid thermal anneal (RTA) step: titanium reacts with silicon forming $TiSi_2$ ((C49) phase); this step is done in a nitrogen atmosphere to avoid forming $TiSi_2$ on the oxide and forms a TiN layer on the titanium;
3. the wafer is removed and selectively etched to the TiN and unreacted Ti; and
4 a second RTA step is performed whereby $TiSi_2$ is transformed from the high resistivity phase (C49) to the low resistivity phase (C54).

The above-described process involves four steps including two high temperature rapid annealing steps. The advantage of RTA versus conventional annealing is that RTA reduces the "thermal budget", defined as the time the wafer stays in the furnace at high temperature. In general, reducing the thermal budget is desirable. An alternative way to obtain a silicide film on a wafer would be by depositing a silicide film by sputtering a silicide target. Sputter deposition of silicide film using a silicide target offers the following advantages:

1. eliminates the need for high temperature rapid thermal annealing steps, provided a C54 film can be deposited;
2. reduces silicon consumption from the wafer;
3. eliminates the phase transformation step; and
4. provides an opportunity to deposit an amorphous film.

Aluminides of Ti and Ta are useful barrier materials in the manufacture of integrated circuits. During the manufacture of integrated circuits Ti and Al layers often react to form titanium aluminide during wafer processing. However, formation of titanium aluminide during wafer processing is detrimental to the wafer because it introduces additional stresses in the film and also consumes Ti and Al from interconnect wiring. In order to prevent titanium aluminide formation and consumption of interconnect metal in the wafer during processing, it is desirable to deposit titanium aluminide by sputtering a titanium aluminide target. Depositing a titanium aluminide film eliminates the introduction of stresses associated with formation of titanium aluminide and eliminates unnecessary consumption of interconnect metal.

SUMMARY

In one aspect, the invention includes a non-magnetic physical vapor deposition target. The target has at least 30 atom percent total of one or more of Co, Ni, Ta, Ti, Pt, Mo and W, and at least 10 atom percent silicon. The target also has one phase and not more than 1% of any additional phases other than said one phase.

In another aspect, the invention includes a non-magnetic physical vapor deposition target consisting essentially of Co and/or Ni, silicon, and one phase.

In another aspect, the invention relates to a method of making enhanced purity stoichiometric and non-stoichiometric articles, such as targets for sputtering and related microelectronics applications, and to such articles, including targets. Stoichiometric articles are defined as single phase microstructure having a chemical composition as predicted by the phase diagram of the constituent elements e.g. $TiAl_3$, $WSi_2$, $TiSi_2$, etc. Non-stoichiometric articles are defined as articles, such as targets, having a composition different from the stoichiometric composition predicted by the phase diagram of the constituent elements e.g. $TiSi_{2.4}$, $WSi_{2.8}$, etc. By practicing the invention it is possible to fabricate single phase stoichiometric articles, such as targets and dual-phase non-stoichiometric articles, such as targets, with high densities, higher purity than the starting material, and fine microstructure. Higher purity targets are beneficial for sputtering because they lead to less defects on the silicon wafer thereby increasing yields.

Enhanced purity stoichiometric and non-stoichiometric articles, such as sputtering targets, in accordance with one aspect of the invention which possess a density of 95% or higher of theoretical density and a microstructure not exceeding 20 microns, depending on the chemistry and composition of the article, e.g. target, and its constituent elements.

Enhanced purity articles, such as targets, are defined as having an overall purity (combination of metallic, non-metallic and gaseous components) higher than that of the starting material. The articles may be manufactured by using a combination of reactive sintering, sintering and vacuum hot pressing. It has been found that such a combination can be performed in situ in a vacuum hot press which enables the process to be a one-step process to manufacture stoichiometric and non-stoichiometric articles, such as sputtering targets starting from elemental powders, (i.e. elements in powder form).

BRIEF DESCRIPTION OF THE DRAWINGS

FIG. 1 is a photomicrograph of the grain structure of $TiAl_3$ target produced in accordance with an embodiment of the invention (100×, grain size 18 microns).

DETAILED DESCRIPTION

One aspect of the invention comprises a one-step method of making enhanced purity, high density, fine microstructure sputtering targets using a combination of reactive sintering and vacuum hot pressing. It is noted that the invention also encompasses variations in the process depending on the starting material and final composition desired.

A preferred embodiment of the method of the invention comprises a process that includes reactive sintering and vacuum hot pressing together. This process results in a high density blank, i.e., greater than 95% density, which can be utilized to form sputtering targets. The invention includes a method of making an article particularly useful as a sputtering target having enhanced purity comprising metal (M) and either silicon (Si) or aluminum (Al), from powder. For the method for producing an aluminide sputtering target, M comprises Ti, Fe, Co, Ni and/or Ta, and for the method for producing a silicide target, M comprises Ti, Ta, Ni, Cr, Co and/or Pt. Preferred embodiment of the invention can comprise the following steps, which may be combined or rearranged in order:

(a) providing a heat-resisting pressing die having a cavity with a configuration and dimensions desirable for producing the desired article, for example a sputtering target; the die has at least one movable pressing ram adapted for application of axial compaction forces to material in said cavity;

(b) blending metal (M) and either silicon (Si) or aluminum (Al) powder in proportionate ratio to provide the desired composition, advantageously both powders have sizes less than or equal to 45 mm;

(c) adding sufficient amounts of the blended mix into the cavity of the heat-resistant die so as to be able to yield a dense compact having substantially desired dimensions, for example, of a sputtering target;

(d) placing the die in the vacuum hot-press chamber;

(e) applying a containment pressure to the mixture in the die adapted to be under high vacuum conditions by means of at least one moving ram capable of applying uniaxial compaction forces; advantageously, the containment pressure is sufficient to contain said mixture in said die;

(f) evacuating said chamber and said die, preferably about $10^{-4}$ Torr or less;

(g) heating said die containing the said mixture in the vacuum hot-press chamber to a first temperature sufficient to remove moisture and to volatilize alkali metals while maintaining uniaxial compaction pressure and a pressure of not more than about $10^{-4}$ Torr;

(h) maintaining said first temperature for a time period sufficient to substantially remove gases and alkali metals from the mixture;

(i) heating the said die containing the said mixture in the vacuum hot-press chamber to a second temperature preferably ranging from about 500–1500° C. to allow the powders to reactively sinter under a containing pressure and high vacuum;

(j) increasing uniaxial compaction pressure, preferably about 1000–6000 psi;

(k) maintaining said compaction force under said vacuum and at said second temperature for a time sufficient to allow for reactive sintering process to complete and effect desired compaction of the said mixture;

(l) releasing said compaction force while maintaining high vacuum of preferably about $10^{-4}$ Torr or less;

(m) slowly cooling said die to relieve stresses in the compact while maintaining high vacuum, preferably to about 300° C. or less and about $10^{-4}$ Torr or less;

(n) releasing vacuum;

(o) removing cooled compact from die; and (p) recovering the article, and further processing as desired to produce a sputtering target with desired composition and enhanced purity.

Other preferred conditions are:

metal powder having particle sizes smaller than about 45 microns, including aluminum or silicon powder of a size smaller than about 45 microns;

mixing in an inert gas atmosphere;

using a containment pressure in step (e) in the range of about 200–1000 psi;

heating the die at a rate of up to about 5° C./min to a first temperature range of about 300 to 500° C. while maintaining a containment pressure ranging from about 200 to 1000 psi and a vacuum of at least $10^{-4}$ Torr;

heating the die at a rate of up to about 10° C./min to a second temperature range of about 500–1000° C. while maintaining a containment pressure of up to 6000 psi and vacuum pressure of $10^{-4}$ Torr or less;

heating the die at a rate of up to 10° C./min to a densification and purification temperature range of 900–1500° C. while maintaining a containment pressure of up to 6000 psi and vacuum of at least $10^{-4}$ Torr or less;

slowly cooling the die under a containment pressure of up to about 6000 psi until the temperature reaches a minimum of 1300° C., whereafter the containment pressure is released, while maintaining a vacuum pressure at $10^{-4}$ Torr or less;

cooling the die in a vacuum pressure of $10^{-4}$ Torr or less until the temperature reaches about 500° C. whereafter the die is further cooled by a flowing inert gas;

the inert gas used to cool the die is helium;

the stoichiometric product, for example a sputtering target, comprises or consists essentially of one phase with the second phase not exceeding more than about 1%;

the non-stoichiometric product, for example a sputtering target, comprises or consists essentially of two phases with any and all additional phases not exceeding about 1%;

the characteristics of the enhanced purity stoichiometric and non-stoichiometric article, for example a sputtering target, has a density of at least 95% of theoretical density, substantially no porosity, and impurities that have been reduced by at least 5%;

the density is at least equal to the theoretical density; and the cooled compact has substantially the desired dimensions of the article, for example a sputtering target, which is then ground to the final desired dimensions.

One preferred process route is outlined in Table 1. In this and all following examples, some of the steps may be combined, and the process may be performed "in situ" in the same equipment.

TABLE 1

| PROCESS STEP | GENERAL | PREFERRED CONDITIONS |
|---|---|---|
| Blending | Blend appropriate proportions of elemental powders | Ar atmosphere for 30–90 minutes depending on starting material |
| Loading | Pour into graphite dies and load dies into vacuum hot press | |
| Evacuate | Evacuate chamber to achieve a pressure of 10 Torr or less | |
| Pre-compaction | To produce "green" compact | 200–1000 psi |
| Degassing | To remove volatile gases and moisture | 300–500° C. |
| Reactive Sintering | Powders are sintered reactively to form desired compounds | 500–1000° C., $10^{-4}$ Torr, 60–240 minutes |
| Densification and Purification | Apply additional pressure to achieve desired density and removal of volatile reaction products | 1000–6000 psi, $10^{-4}$ Torr, 900–1500° C. |
| Cooling | Slow cooling to prevent thermal shock | Furnace cool under atmosphere control |

The process parameters are defined in ranges because it has been found that in order to achieve the desired chemical composition and phases in the sputtering target, temperatures, heating and cooling rates, vacuum, hold times and pressure should be controlled. The specific process parameters will depend on the starting materials and desired composition.

It has also been found that sintering powders which react exothermically result in adiabatic temperature rises. This sudden rise in temperature causes impurities to volatilize, and the volatized materials can then be evacuated with a vacuum system. The resulting grain size of the near-net sized product depends on the particle size distribution of elemental powders, and the nucleation and growth of new phases. Since the reaction occurs between powders which are uniformly blended, there are innumerable nucleation sites for new phases. Grain growth typically requires high temperatures but the new phases are not held at elevated temperature for extended periods of time, and grain growth is restricted, which results in a fine grain structure on the sputtering target. The exact grain size or range depends on the starting material. High pressures for densification are applied when the temperature rises because the reacted powders are then more ductile and easy to compact. Accomplishing this results in high densities. As mentioned previously, achieving desired phases in the product depends on control of the reactive sintering and densification processes in the vacuum hot press. The following examples illustrate the process. The invention described above describes a method to achieve success.

One example of the process for producing $TiAl_3$ articles is described in Table 2.

TABLE 2

| PROCESS STEP | GENERAL | PREFERRED CONDITIONS |
|---|---|---|
| Blending | Blend 37.15 wt % Ti and 62.85 wt % Al powders in a V-blender | Ar atmosphere for 60 minutes |
| Loading | Pour into graphite dies and load into vacuum hot press | |
| Evacuate | Evacuate chamber to achieve $10^{-4}$ Torr pressure | |
| Pre-compaction | Apply pressure to form a compact | 600 psi |
| First Degassing | Remove volatile gases and moisture | 350° C. |
| Compaction | To assist the reactive sintering process | 4000 psi for 180 minutes |
| Reactive Sintering | Powders are sintered reactively to form desired compounds | 600° C., $10^{-4}$ Torr, hold for 90 minutes |
| Densification and Purification | Apply additional pressure to achieve desired density and removal of volatile reaction products | 5000 psi, $10^{-4}$ Torr, 600° C. hold for 90 minutes Note: Pressure for densification can be applied either continuously or in small increments |
| Second Degassing | To remove volatile gases which were not removed by the first degassing step | 5000 psi, $10^{-4}$ Torr, 1050° C., hold for 60 minutes |
| Cooling | Slow cooling to prevent thermal shock | Furnace cool under vacuum |
| Release Pressure | Release pressure | Release pressure |

Since the reactive sintering process is initiated by diffusion and the rate of sintering depends on the packing density of the powders, a compaction step prior to reactive sintering assists in increasing the reaction rate. The degassing step removes moisture. During the reactive sintering process step, the titanium and aluminum powders in this example react to produce $TiAl_3$. Control of process parameters ensures that the reaction occurs uniformly throughout the powder mixture resulting in a fine-grained (due to several nucleating sites) single phase near-net shaped $TiAl_3$ blank. The exothermic nature of the reaction leads to a temperature increase which makes the reacted powder mixture plastic and thus easy to densify. The second degassing step removes the gases given out during the exothermic reactive process. The combination of two degassing steps at low and elevated temperatures prior to and after the reactive sintering step results in reduction of alkali and gaseous impurities and an enhanced purity article especially useful as a sputtering target.

The advantage of the process is reflected by absence of elemental Ti and Al powders in the finished article. This is determined by analyzing the near-net shaped blank using x-ray diffraction, SEM/EDS, and Atomic Absorption.

Figure 2:
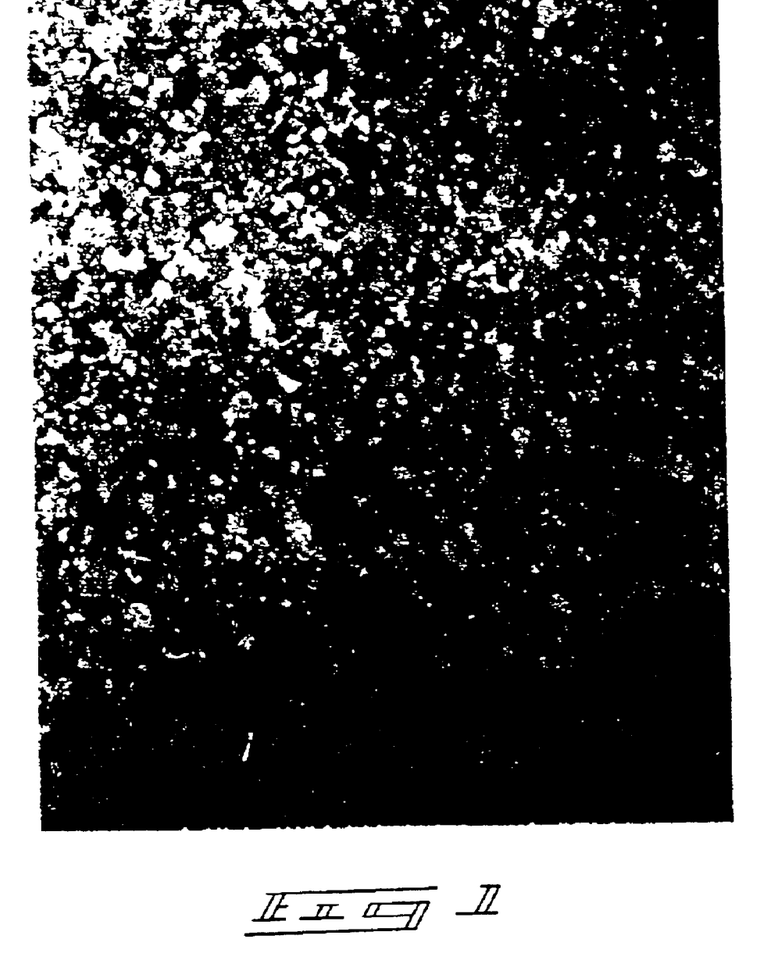
FIG. 2 is a graph showing the x-ray diffraction pattern of a target produced in accordance with one embodiment of the invention.

FIG. 1 shows the grain structure of a $TiAl_3$ target processed using the process described above. The photomicrograph clearly shows that the grain size is less than 20 microns. FIG. 2 shows the x-ray diffraction pattern of a sample piece obtained from the target. The x-ray diffraction pattern shows the presence of a single phase $TiAl_3$ compound.

Chemical analysis using GDMS, LECO and SIMS confirm that the purity of the finished product was higher than that of the original starting powders.

An example of a method of making non-stoichiometric $TiSi_2$ blank useful as a sputtering target is described in Table 3.

TABLE 3

| PROCESS STEP | GENERAL | PREFERRED CONDITIONS |
|---|---|---|
| Blending | Blend 325 mesh proportions of elemental titanium and silicon powders | Ar atmosphere for 60 minutes |
| Loading | Pour into graphite dies and load dies into vacuum hot press | |
| Evacuate | Evacuate chamber to achieve $10^4$ Torr pressure | |
| Pre-compaction | Apply pressure to compact | 736 psi |
| Degassing | To remove volatile gases and moisture | 315° C. |
| Reactive Sintering | Powders are sintered reactively to form desired compounds | 965° C., $10^{-4}$ Torr, 120 minutes Note: Pressure for densification can be applied either continuously or in small increments |
| Densification and Purification | Apply additional pressure to achieve desired density and removal of volatile reaction products | 5000 psi, $10^{-4}$ Torr, hold for 120 minutes at 965° C. |
| Second Degassing | To remove volatile gases which were not removed by the first degassing step | 1360° C. for 90 minutes; 5000 psi |
| Cooling | Slow cooling to prevent thermal shock | Furnace cool under vacuum until temperature reaches 1100° C. followed by back-filling with He and cooling fans Note: Cooling rates can be varied depending on product requirements |
| Release Pressure | To prevent mechanical shock during cooling | Release pressure at 1100° C. |

Figure 3:
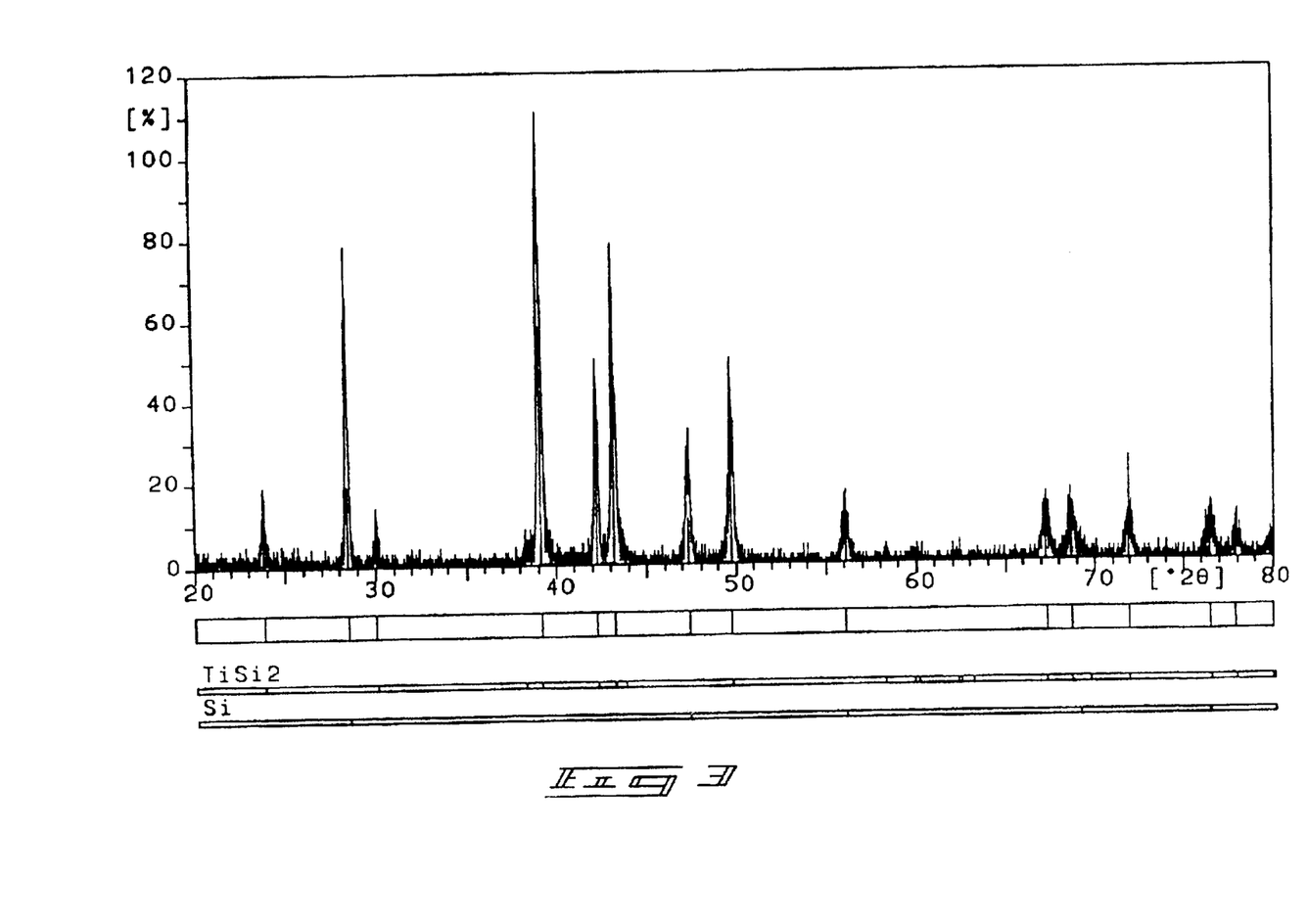
FIG. 3 is a graph of an analysis of titanium silicide.
Figure 4:
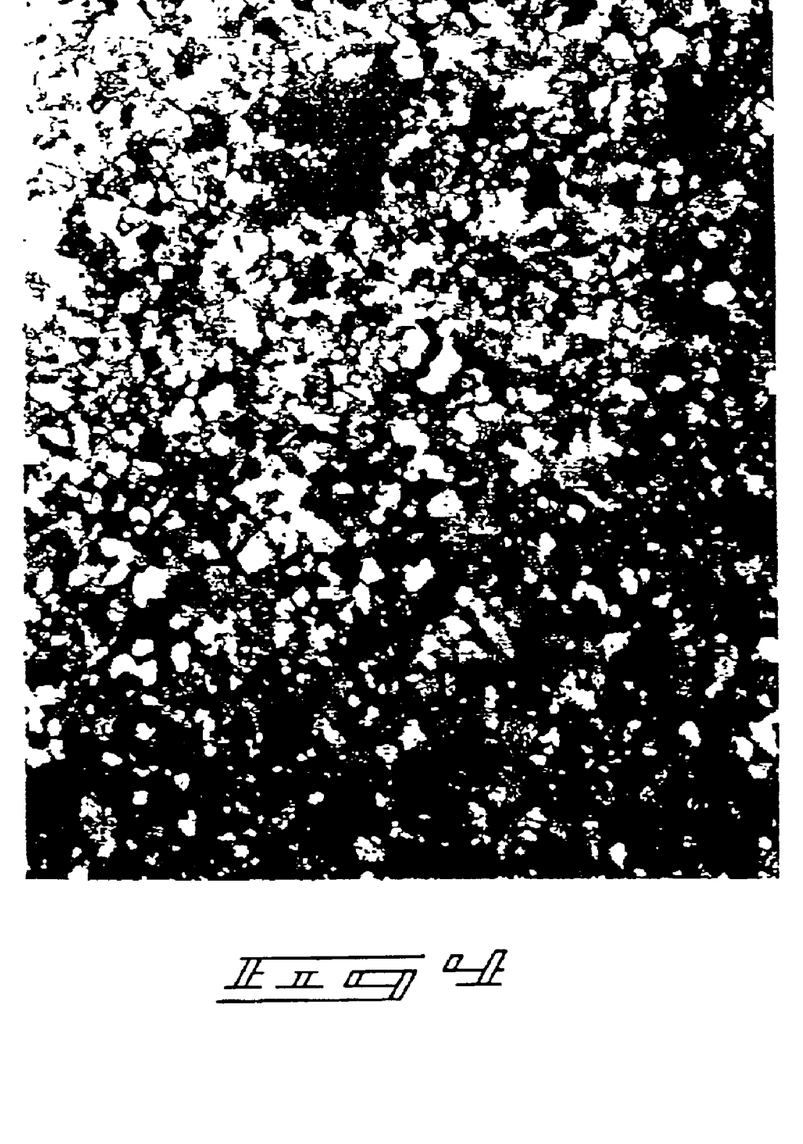
FIG. 4 is a photomicrograph of the grain structure of $TiSi_2$ target produced in accordance with one embodiment of the invention (100×, grain size 18 microns; cracks observed are an artifact of the sample mounting, grinding and polishing process).

FIG. 3, which represents the analysis of titanium silicide target using x-ray diffraction, revealed that the target contained two phases as expected. The two phases were $TiSi_2$ and Si. Further analysis indicated that the $TiSi_2$ is in the C54 phase, which is a low resistivity phase. The microstructural analysis showed a fine microstructure with an average grain size less than 20 microns (FIG. 4). GDMS, LECO and SIMS analysis showed that the overall purity of the target was higher than that of the starting powders.

Tables 4, 5 and 6 describe typical compositions of titanium aluminide, titanium suicide and tungsten silicide, respectively, which may be produced. Furthermore, when these compositions are produced as sputtering targets, it has been confirmed that the targets will produce films of titanium aluminide, titanium silicide and tungsten silicide, respectively, on a substrate.

TABLE 4

99.98% pure $TiAl_3$
Units = ppm

| Element | Maximum |
|---|---|
| Ag | 1.00 |
| Al | MC |
| As | 1.00 |
| B | 2.00 |
| Ca | 10.00 |
| Cl | 10.00 |
| Co | 2.00 |
| Cr | 10.00 |
| Cu | 15.00 |
| Fe | 25.00 |
| In | 5.00 |
| K | 0.50 |
| Li | 0.10 |
| Mg | 10.00 |
| Mn | 10.00 |
| Mo | 1.00 |
| Na | 1.00 |
| Nb | 1.00 |
| Ni | 15.00 |
| P | 15.00 |
| Pb | 5.00 |
| S | 15.00 |
| Si | 50 |
| Sn | 5.00 |
| Th | 0.10 |
| U | 0.10 |
| V | 5.00 |
| Zn | 5.00 |
| Zr | 5.00 |
| O | 3000 |
| C | 100 |
| N | 300 |

Maximum Total Metallic Impurities: 200 ppm
Method of Analysis: C, O, N, by LECO; Na, K, Li by SIMS; all others by GDMS.
Molar Ratio controlled to within +/−0.1 of nominal value. Major constituents analyzed by Flame A.A.
Metallographic analysis is routinely performed on each manufactured lot of $TiAl_3$ ensuring lot-to-lot and target-to-target consistency.

TABLE 5

99.995% pure $TiSi_{2xx}$
Units = ppm

| Element | Maximum |
|---|---|
| Ag | 0.10 |
| Al | 15.00 |
| As | 1.00 |
| B | 2.00 |
| Ca | 2.00 |
| Cl | 10.00 |
| Co | 2.00 |
| Cr | 10.00 |
| Cu | 2.00 |
| Fe | 15.00 |
| In | 0.10 |
| K | 0.10 |
| L | 0.0001 |
| Mg | 0.05 |
| Mn | 0.30 |
| Mo | 1.00 |
| Na | 5.00 |
| Nb | 1.00 |
| Ni | 5.00 |
| P | 2.50 |
| Pb | 0.10 |
| S | 5.00 |
| Si | MC |
| Sn | 3.00 |
| Th | 0.001 |

TABLE 5-continued 99.995% pure TiSi$_{2xx}$
Units = ppm

| Element | Maximum |
|---|---|
| U | 0.001 |
| V | 1.00 |
| Zn | 0.50 |
| Zr | 2.50 |
| O | 3000 |
| C | 100 |
| N | 100 |

Maximum Total Metallic Impurities: 50 ppm
Method of Analysis: C, O, N, by LECO; Na, K, Li by SIMS; all others by GDMS.
Molar Ratio controlled to within +/−0.1 of nominal value. Silicon concentration analyzed by Inductively Coupled Plasma Mass Spectrograph or Atomic Absorption techniques.

TABLE 6

99.995% pure WSi$_{2xx}$
Units = ppm

| Element | Maximum |
|---|---|
| Ag | 0.10 |
| Al | 2.00 |
| As | 1.00 |
| B | 0.10 |
| Ca | 2.00 |
| Cl | 2.00 |
| Co | 2.00 |
| Cr | 4.00 |
| Cu | 2.00 |
| Fe | 5.00 |
| In | 0.50 |
| K | 0.50 |
| Li | 0.001 |
| Mg | 0.05 |
| Mn | 0.30 |
| Mo | 1.00 |
| Na | 0.50 |
| Nb | 0.50 |
| Ni | 1.00 |
| P | 2.50 |
| Pb | 0.10 |
| S | 2.00 |
| Si | MC |
| Sn | 1.00 |
| Th | 0.001 |
| U | 0.001 |
| V | 1.00 |
| Zn | 0.50 |
| Zr | 0.50 |
| O | 1000 |
| C | 70 |
| N | 20 |

Maximum Total Metallic Impurities: 50 ppm
Method of Analysis: C, O, N, by LECO; Na, K, Li by SIMS; all others by GDMS.
Molar Ratio controlled to within +/−0.1 of nominal value. Silicon concentration analyzed by Inductively Coupled Plasma Mass Spectrograph or Atomic Absorption techniques.

Figure 5:
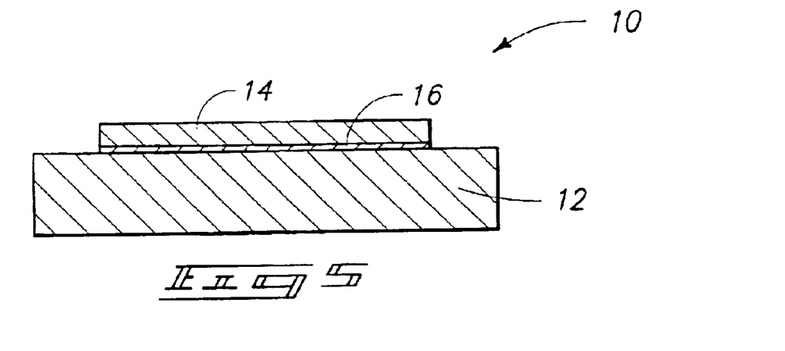
FIG. 5 is a diagrammatic, cross-sectional view of an exemplary sputtering target construction encompassed by the present invention.
Figure 6:
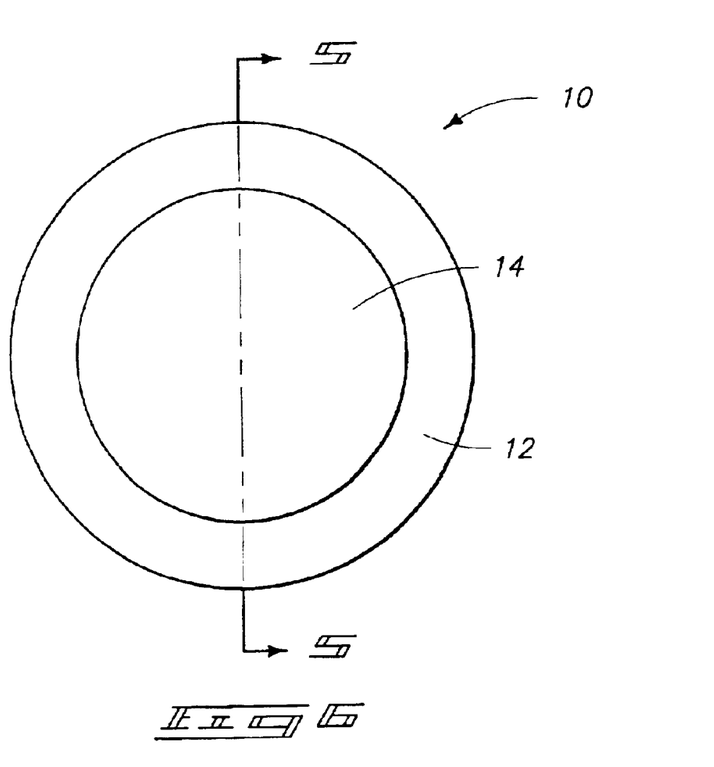
FIG. 6 is a top view of the FIG. 5 target.

An exemplary target construction which can be formed in accordance with methodology of the present invention is described with reference to FIGS. 5 and 6. Specifically, a target assembly 10 is illustrated, which comprises a copper-containing backing plate 12 and a target 14 joined to backing plate 12 through an interface layer 16. Backing plate 12 can comprise, consist or, or consist essentially of copper. Interface layer 16 can comprise a nickel plating, in combination with an indium-containing material. Target 14 can comprise, consist of, or consist essentially of one or more of cobalt, nickel, tantalum, titanium, platinum, molybdenum and tungsten in combination with silicon. In particular embodiments, target 14 can be non-magnetic, and comprise at least 30 atomic % of either cobalt or nickel. The target can further comprise at least 10% silicon. In an exemplary application, a non-magnetic target comprises CoSi$_2$. In other embodiments, the target can consist of, or consist essentially of, CoSi$_2$. Further, the target can consist of, or consist essentially of cobalt and silicon; or alternatively can consist of or consist essentially of nickel and silicon. For purposes of interpreting this disclosure and the claims that follow, a non-magnetic material is defined as a material having a pass through flux of about 100%. Exemplary non-magnetic target compositions of the present invention comprise at least 30 atom percent total of one or more of Co, Ni, Ta, Ti, Pt, Mo and W; at least 10 atom percent silicon; one phase comprising the one or more of Co, Ni, Ta, Ti, Pt, Mo and W; and not more than 1% of any additional phases comprising the one or more of Co, Ni, Ta, Ti, Pt, Mo and W other than said one phase. The targets can, in particular aspects of the present invention, comprise not more than 1% of any additional phases other than said one phase comprising one or more of Co, Ni, Ta, Ti, Pt, Mo and W.

A particular non-magnetic target composition formed in accordance with the present invention comprises at least 20 atom percent W, in particular cases at least 25 atom percent W, and in some cases about 26 atom percent W; and further comprises at least 10 atom percent silicon. Additionally, the target composition comprises one phase comprising W and not more than 1% of any additional phases other than said one phase. An exemplary target composition will comprise only one phase (i.e., will consist of one phase), and such phase will consist of WSi$_2$.

An exemplary target of the present invention can have a density that approaches a theoretical maximum density. For instance, the target can have a density which is at least 85% of the theoretical maximum density. Alternatively, the target can have a density which is at least 90% of theoretical maximum density, or at least 93% of a theoretical maximum density.

An exemplary process for forming a target of the present invention is described with reference to FIG. 7. Specifically, a mixture of metal and silicon (such as, for example, a mixture of cobalt and silicon) is heated to a first temperature at or above 300° C. (such as, for example, a temperature of from about 300° C. to 500° C.) to remove volatile components form the mixture. The removal of volatile components can alternatively be referred to as degassing of the mixture.

The mixture is then ramped to a second temperature of between 300° C. and 1000° C., and which is utilized for reacting the metal and silicon. The second temperature can be, for example, about 600° C. to accomplish so-called "reactive sintering" as described above in table 2. After the reactive sintering, the material is heated to a third temperature which can comprise, for example, a temperature between 1000° C. and 1400° C., and which is typically a temperature of about 1230° C. During such third heating, the material can be compacted to a pressure of from about 5000 psi to about 8000 psi, and preferably is compacted to a pressure of about 6900 psi, to densify the material. After the final heating, the pressure can be released from the material. Preferably, the pressure is released at a rate of less than or equal to about 245 psi per minute. It is found that various sputtering targets formed in accordance with the present invention will be relatively brittle, and a slow release of pressure (specifically, a release at 245 psi per minute or slower) can alleviate cracking which can otherwise form in the materials. For instance, it is found that targets comprising a mixture of cobalt and silicon can be particularly brittle, and accordingly there can be substantial advantages to releasing the pressure slowly from such materials.

Figure 8:
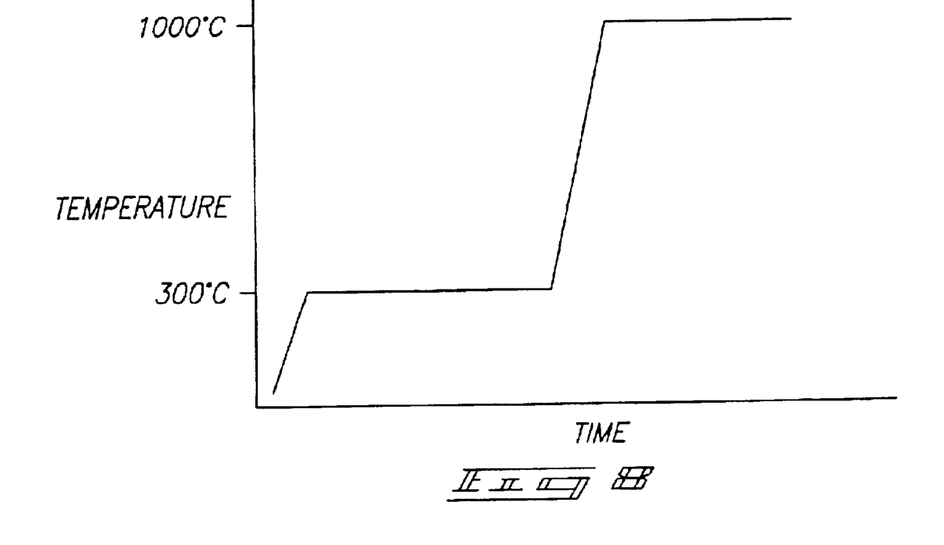
FIG. 8 is a graph of temperature versus time illustrating another processing sequence which can be utilized in methodology of the present invention.

FIG. 8 illustrates another processing sequence which can be utilized in methodology of the present invention. Specifically, FIG. 8 illustrates a processing sequence in which a mixture of metal and silicon is first heated to a temperature of from about 300° C. to about 500° C., and subjected to a pressure of from about 500 psi to about 1000 psi, to allow degassing of the material. The pressure can, for example, be about 660 psi, and the temperature can, for example, be about 340° C. After the initial degassing, the material is heated to a second temperature of from about 1000° C. to about 1400° C. (for example, about 1230° C.), and compressed under a pressure of from about 500 psi to about 8000 psi (for example about 6900 psi) to compact the material. After the compaction, the temperature is reduced to room temperature, and the pressure is reduced to atmospheric pressure, with the pressure being reduced at a rate of less than or equal to about 245 psi per minute.

Figure 7:
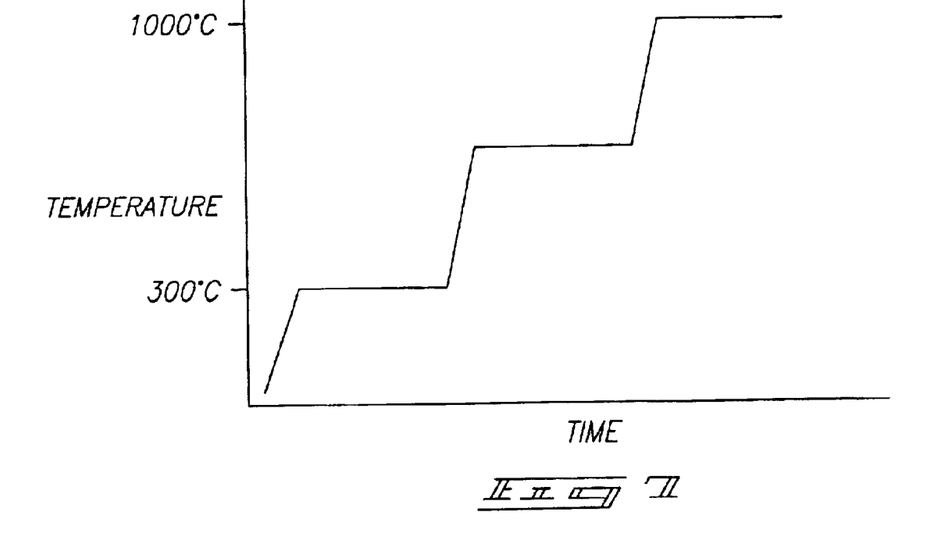
FIG. 7 is a graph of temperature versus time illustrating a processing sequence which can be utilized in methodology of the present invention.

The processing of FIG. 8 can be advantageous relative to that of FIG. 7, in that it eliminates a processing step, and accordingly can save processing time and complexity relative to that of FIG. 7. Further, particular materials (such as, for example, cobalt silicide) undergo reactive sintering at relatively high temperatures, (such as temperatures exceeding about 1000° C.), and accordingly it can be advantageous to accomplish the compaction and reactive sintering in a common step, instead of separating the reactive sintering into a separate step as exemplified by the FIG. 7 process.

In a particular embodiment a material consisting essentially of cobalt and silicon or consisting of cobalt and silicon is subjected to the following processing sequence. The material can be formed by blending cobalt and silicon together for about 90 minutes. Initially, the material is ramped to a compression of about 27 tons (660 psi) at a rate of about 5 tons/minute (122 psi per minute). The temperature of the material is ramped to about 340° C. at a rate of about 300° C./hour during the compression. The material is held at the compression of about 27 tons for about 60 minutes, and is then compressed to about 136 tons (about 3330 psi) at a rate of about 3 tons/minute (73 psi per minute) while ramping the temperature to about 740° C. at a rate of about 400° C./hour. The material is held at the compression of about 136 tons for about 60 minutes, and is then compressed to about 282 tons (about 6900 psi) at a rate of about 3 tons/minute (73 psi per minute) while ramping the temperature to about 1025° C. at a rate of about 400° C./hour. The material is held at the compression of about 282 tons and about 1025° C. for about 60 minutes, and then the temperature is ramped to about 1230° C. at a rate of about 400° C./hour. The material is held at the compression of about 282 tons and about 1230° C. for about 90 minutes, and then the heaters are turned off and the compression is released at a rate of about 245 psi/minute (10 ton/minute) while the temperature cools at a rate of about 1000° C./hour. The resulting material consists essentially of, or consists of, $CoSi_2$, and has a density that is at least about 93% of theoretical. In a particular application, the material had a density of about 5.3 gram/cm³, which is about 100% of the theoretical density. The $CoSi_2$ material can be subjected to surface grinding and appropriate cleaning, and then formed into a sputtering target.

We claim:

1. A physical vapor deposition target, comprising:
   at least 30 atom percent cobalt;
   at least 10 atom percent silicon; and
   one phase comprising cobalt, and not more than 1% of any additional phases comprising cobalt other than said one phase.

2. The physical vapor deposition target of claim 1, wherein the target is non-magnetic.

3. The physical vapor deposition target of claim 1, wherein the target comprises no more than 1% of any additional phases which do not comprise cobalt.

4. The physical vapor deposition target of claim 1 comprising a density that is at least 85% of a theoretical maximum density of the material of the target.

5. The physical vapor deposition target of claim 1 comprising a density that is at least 90% of a theoretical maximum density of the material of the target.

6. The physical vapor deposition target of claim 1 comprising a density that is at least 93% of a theoretical maximum density of the material of the target.

7. The physical vapor deposition target of claim 1 consisting essentially of the cobalt and silicon.

8. The physical vapor deposition target of claim 1 consisting of the cobalt and silicon.

9. The physical vapor deposition target of claim 1 consisting essentially of $CoSi_2$.

10. A physical vapor deposition target, comprising:
    at least 30 atom percent nickel;
    at least 10 atom percent silicon; and
    one phase comprising nickel, and not more than 1% of any additional phases comprising nickel other than said one phase.

11. The physical vapor deposition target of claim 10 comprising a density that is at least 85% of a theoretical maximum density of the material of the target.

12. The physical vapor deposition target of claim 10 wherein the target comprises less than 1% of any additional phases which do not comprise nickel.

13. The physical vapor deposition target of claim 10, wherein the target is non-magnetic.

14. The physical vapor deposition target of claim 10 consisting essentially of the Ni and silicon.

15. The physical vapor deposition target of claim 10 consisting of the Ni and silicon.

16. A physical vapor deposition target, comprising:
    at least 30 atom percent total of one or more of Co, Ni, Ta, Ti, Pt, and Mo;
    at least 10 atom percent silicon;
    one phase comprising the one or more of Co, Ni, Ta, Ti, Pt, and Mo and not more than 1% of any additional phases comprising the one or more of Co, Ni, Ta, Ti, Pt, and Mo other than said one phase; and
    wherein the target is non-magnetic.

17. The physical vapor deposition target of claim 16 comprising a density that is at least 85% of a theoretical maximum density of the material of the target.

18. The physical vapor deposition target of claim 16 wherein the target comprises no more than 1% of any additional phases which do not comprise one or more of Co, Ni, Ta, Ti, Pt and Mo.

19. The physical vapor deposition target of claim 16 comprising at least 30 atom percent of Ta.

20. The physical vapor deposition target of claim 16 comprising at least 30 atom percent of Ti.

21. The physical vapor deposition target of claim 16 comprising at least 30 atom percent of Pt.

22. The physical vapor deposition target of claim 16 comprising at least 30 atom percent of Mo.

23. A physical vapor deposition target, comprising:
    at least 20 atom percent total of W;
    at least 10 atom percent silicon;
    one phase comprising $WSi_2$ and not more than 1% of any additional phases other than said one phase; and
    wherein the target is non-magnetic.

24. The target of claim 23 wherein the W concentration is at least 25 atom percent.

* * * * *

UNITED STATES PATENT AND TRADEMARK OFFICE
CERTIFICATE OF CORRECTION

PATENT NO. : 6,713,391 B2  
DATED : March 30, 2004  
INVENTOR(S) : Wuwen Yi et al.

It is certified that error appears in the above-identified patent and that said Letters Patent is hereby corrected as shown below:

Title page,
Item [75], Inventors, replace "Tse" with -- tse --.

Column 1,
Line 41, replace "suicides" with -- silicides --.
Line 58, replace "4" with -- 4. --

Column 2,
Line 56, delete "which".

Column 3,
Line 50, replace "embodiment" with -- embodiments --.

Column 4,
Line 33, replace "10-$^4$" with -- $10^{-4}$ --.

Column 7,
Line 7, insert -- a -- after "making".
Line 61, replace "suicide" with -- silicide --.

Column 10,
Line 44, replace "form" with -- from --.

Signed and Sealed this

Third Day of May, 2005

JON W. DUDAS  
*Director of the United States Patent and Trademark Office*